United States Patent [19]

Leamy et al.

[11] 4,364,778
[45] Dec. 21, 1982

[54] FORMATION OF MULTILAYER DOPANT DISTRIBUTIONS IN A SEMICONDUCTOR

[75] Inventors: Harry J. Leamy, Summit; Thomas E. Seidel, Berkeley Heights, both of N.J.

[73] Assignee: Bell Telephone Laboratories, Incorporated, Murray Hill, N.J.

[21] Appl. No.: 154,855

[22] Filed: May 30, 1980

[51] Int. Cl.³ .................... H01L 7/34; H01L 21/265
[52] U.S. Cl. .................... 148/1.5; 148/187; 219/121 LH; 357/91; 427/53.1
[58] Field of Search .................. 148/1.5, 187; 357/13, 357/91; 427/53.1; 219/121 LH

[56] References Cited

U.S. PATENT DOCUMENTS

| | | | |
|---|---|---|---|
| 2,739,088 | 3/1956 | Pfann | 148/1.5 |
| 2,822,308 | 2/1958 | Hall | 148/1.5 |
| 2,822,309 | 4/1958 | Hall | 148/1.5 |
| 3,629,017 | 12/1971 | Stork | 148/180 |
| 3,940,289 | 2/1976 | Marquardt et al. | 148/1.5 |
| 3,972,741 | 8/1976 | Anthony et al. | 148/1.5 |
| 4,147,563 | 4/1979 | Narayan et al. | 148/1.5 |
| 4,181,538 | 1/1980 | Narayan et al. | 148/1.5 |
| 4,203,781 | 5/1980 | Miller | 148/1.5 |

OTHER PUBLICATIONS

Leamy et al., Jour. Crystal Growth, 48, (Mar. 1980) 379.
Wittmer et al., Jour. Appl. Phys. 49 (1979) 5827.
Poate et al., in AIP Conf. Proc. #50, N.Y., 1979, pp. 527-531.
Barnes et al., in AIP Conf. Proc. #50, N.Y., 1979, pp. 647-652.
Appleton et al., in AIP Conf. Proc. #50, N.Y., 1979, 291.
Dvurechensky et al., in AIP Conf. Proc. #50, N.Y., 1979, 245.
Hall, J. Phys. Chem. 57 (1953) 836.
Slichter et al., Phys. Rev. 90 (1953) 987.
Celler et al., Appl. Phys. Letts. 32 (1978) 464.
Bean et al., in AIP Conf. Proc. #50 (eds. Ferris et al.), N.Y., 1979, pp. 123-128.
White et al., Appl. Phys. Letts. 33 (1978) 662.
Ohkura et al., Japan Jour. Appl. Phys. 19 (Feb. 1980), L-83.
Hodgson et al., IBM-TDB, 21 (1979) 4286.
Maenpaa et al., Thin Solid Films, 67 (Apr. 1980) 293.

*Primary Examiner*—Upendra Roy
*Attorney, Agent, or Firm*—James H. Fox; Peter V. D. Wilde

[57] ABSTRACT

A method of making solid state devices having multilayer dopant distributions, including p-p+ and n-n+ junctions, etc. A semiconductor body is rapidly melted, typically by a laser, electron beam, or ion beam. Present in the melt is a first dopant having a low segregation coefficient and a second dopant having a high segregation coefficient. During rapid resolidification of the melt, the first dopant segregates toward the surface, while the second dopant remains substantially in place, producing a junction. The production of diodes, bipolar and field effect transistors, Schottky barriers, ohmic contacts, junction isolated surface regions, high conductivity paths, etc., is possible by this method.

18 Claims, 15 Drawing Figures

FORMATION OF MULTILAYER DOPANT DISTRIBUTIONS IN A SEMICONDUCTOR

BACKGROUND OF THE INVENTION

1. Field of the Invention

This invention is directed to a method of obtaining multilayer dopant distributions, including junctions, in semiconductor materials.

2. Description of the Prior Art

In semiconductor processing, a typical method of obtaining a desired distribution of dopants is by diffusion through the surface of a semiconductor body, typically using an oxide mask. Minimum device dimensions are typically related to the smallest lithographic features on the mask. Dopant impurities can also be introduced into a semiconductor body by means of ion implantation. Both surface doped regions and buried regions may be obtained by this technique. Typically, to activate the dopant impurities and to remove damage to the crystal following the ion implantation, the semiconductor is annealed at an elevated temperature.

Recently, the use of laser annealing has been widely studied. In this technique, a laser beam is used to raise the temperature of the semiconductor and thereby remove defects resulting from the ion implantation. Both solid state laser annealing and melting by means of a laser have been utilized to remove defects. Selective radiation by means of a laser can also be used to form devices in the doped layer. For example, a semiconductor body having an initial p-doping may be implanted with n-type dopant ions. A laser may be directed at the body to melt through the ion-implanted region into the underlying single crystal region. Upon resolidification of the melt, a p-n junction is typically obtained.

Laser radiation has also been used to form silicide surface layers on silicon, typically for use as ohmic contacts and for Schottky barrier devices. In this method, a metal, typically a transition metal such as tantalum, niobium, etc., is coated onto the surface of a silicon wafer or else introduced into the surface by means of ion implantation, and laser radiation is used to melt the surface, thereby forming a silicide region in the wafer.

Selective laser irradiation has the advantage that only a small portion of a semiconductor wafer need be heated at any given moment, with the remainder of the wafer remaining relatively cool. In this method, undesired diffusion of dopants in the wafer is avoided. An overview of the current state of the art of laser processing is given in *Laser-Solid Interactions And Laser Processing*—1978, AIP Conference Processings, No. 50, S. D. Ferris, H. J. Leamy, J. M. Poate, editors, published by the American Institute Of Physics, New York (1979).

In addition to laser melting, the use of electron beams and ion beams is known for melting, although lasers are typically presently preferred, due to the ease of implementation. In addition, xenon flash lamps have been used for processing in the solid phase, and work has been directed towards obtaining melting of semiconductor material by means of flash lamps.

SUMMARY OF THE INVENTION

We have invented a method of obtaining multilayer dopant distributions in semiconductor material. In this method, a source of high intensity radiation is directed at a semiconductor body to produce brief melting at the surface. Included in the melt is both a high K and a low K dopant, wherein K is the equilibrium segregation coefficient. The difference in segregation of the dopants during freezing of the melt produces a junction in the resolidified region. Typical sources of radiation include lasers, electron beams, and ion beams. The high K dopant is introduced into, or deposited onto, the surface region that is to be melted. The low K dopant can also be deposited on, or introduced into, the surface region that is to be melted, or can be distributed throughout the semiconductor substrate, or a portion thereof. In any case, the melting extends into a single crystal region of the semiconductor body so that epitaxial regrowth occurs in at least a portion of the resolidified region. Typical dopant distributions produced include p-n, n-n+, and p-p+ junctions, metal-semiconductor junctions, bipolar transistors, MOS and junction field effect transistors, etc. An alloy or compound, typically a silicide, may also be obtained, most typically in the region having the low K dopant.

DETAILED DESCRIPTION

This description relates to a method of producing a desired multilayer dopant distribution, including p-n junctions, p-p+ junctions, n-n+ junctions, metal-semiconductor junctions, etc., by means of rapid melting into a semiconductor surface wherein both a high K and a low K dopant is included in the melt. As used herein, K is the equilibrium segregation coefficient of a given dopant in a given semiconductor, and is conventionally defined as the ratio of the amount of dopant per unit mass in the solid to the amount of dopant per unit mass in the liquid at a solid-liquid interface at thermal equilibrium. The values of K for a wide variety of dopants have been studied for the common semiconductor materials. Included in Table 1 below are the K values for various dopants in silicon. The values for other impurities may be found, for example, in "Solid Solubilities Of Impurity Elements in Germanium And Silicon", F. A. Trumbore, *Bell System Technical Journal*, Vol. 39, page 207, January 1960.

TABLE 1

| | Equilibrium Segregation Coefficient In Silicon |
|---|---|
| I. High K Dopants | |
| B | 0.80 |
| P | 0.35 |
| As | 0.3 |
| II. Low K Dopants | |
| Li | 0.01 |
| Al | 0.002 |
| Ga | 0.008 |
| In | $4 \times 10^{-4}$ |
| Tl | Small |
| Sb | 0.023 |
| Bi | $7 \times 10^{-4}$ |
| Pt | Small |

As used herein, the term "high K dopant" means a dopant having a K value of greater than 0.1 in a given semiconductor, and the term "low K dopant" means a dopant having a K value of less than 0.1 in a given semiconductor. It will be recognized by persons skilled in the art that the effective K values obtained during the rapid resolidification of the melt in the present technique are significantly higher than the equilibrium K values in some cases. That is, less segregation takes place for a given dopant with relatively rapid resolidification then occurs with relatively slow resolidification of the melt. Nevertheless, it has been found that useful junctions may be obtained by the present method as discussed below. In addition to the dopants being chosen as above, the ratio of the respective high K and low K segregation coefficients is at least a factor of 5 in the present technique.

Figure 1:
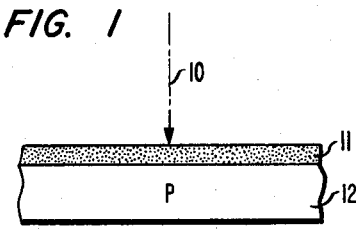
FIG. 1 shows a semiconductor body having high K and low K dopants introduced therein.
Figure 2:
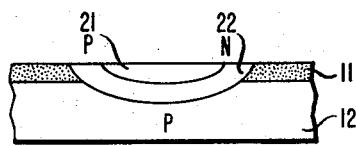
FIG. 2 shows the semiconductor body of FIG. 1 after irradiation.

Referring to FIG. 1, a semiconductor body has an implanted region 11 overlying a doped region 12. This body is irradiated by means of a radiation beam 10 so that melting occurs through the implanted region 11 into the single crystal region 12. Region 11 comprises at least one high K dopant and at least one low K dopant, as defined above. During the lifetime of the melt, both the high K and the low K dopants diffuse approximately equally throughout the melt, even if they were not spatially coincident before melting. That is, one dopant may have been implanted at a lower energy and hence may reside nearer the surface than the other dopant prior to melting. Upon resolidification of the melt, the low K dopant will segregate towards the surface, forming a region having a higher concentration of low K dopant than was originally the concentration prior to melting. The high K dopant, on the other hand, will remain substantially as it was distributed in the melt by diffusion, and is not substantially affected by resolidification. Thus, upon resolidification, a first region will be dominated by the low K dopant, and a second region will be dominated by the high K dopant. As used herein, the term "junction" is defined as the boundary between the regions at the point where the high K and low K dopant concentrations are equal. The junction may be rectifying, as in a p-n or Schottky junction, or nonrectifying, as p-p+ or n-n+ junctions, etc. If the low K dopant is p-type doping material and the high K dopant is n-type doping material, the structure shown in FIG. 2 will be obtained. Under appropriate conditions, the structure is useful as a bipolar transistor, a junction field effect transistor, etc., as is discussed further below.

Figure 3:
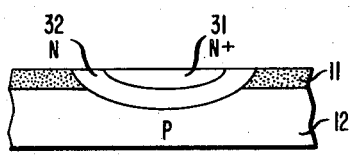
FIG. 3 shows an alternate embodiment of the semiconductor body of FIG. 1 after irradiation.

Note that as the melt refreezes, the low K dopant segregates towards the center of the irradiated region by freezing in from the sides of the melt as well as segregating upward as the melt refreezes upward from the semiconductor body. Hence, the junction between areas 21 and 22 bends upward, typically reaching the surface of the semiconductor body and allowing contact to be made directly to region 22. The bending of the junction formed within the melt is more pronounced for relatively long melt times (e.g., typically on the order of a millisecond) than for relatively short melt times, as the horizontal and vertical temperature gradients are more comparable for long melt times. With short melt times, the vertical temperature gradients tend to be greater than the horizontal gradients, and the bending of the junction is less. The bending is also related to the width-to-depth aspect ratio of the melt, with broad, shallow melts (high aspect ratio) producing less junction bending than deep melts. If the low K dopant is also n-type dopant, then a structure as shown in FIG. 3 typically results, wherein region 31 is now typically an n+ doped region. This structure may be useful for making an ohmic contact to region 22 or for making a Schottky barrier.

Figure 4:
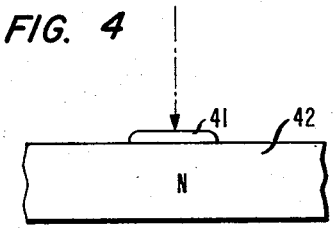
FIG. 4 shows a semiconductor body having a low K dopant initially diffused throughout the body, and a high K dopant deposited on the surface.
Figure 5:
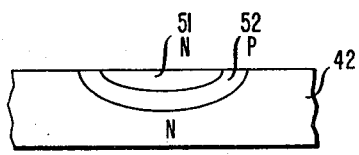
FIG. 5 shows the semiconductor body of FIG. 4 after irradiation.

Since the dopants diffuse rapidly in the melt, the dopants need not be initially implanted in a semiconductor body, as shown in FIG. 1, but rather one or both dopants may subsist on the surface of the semiconductor body. Shown in FIG. 4 is high K dopant 41 located on the surface of semiconductor body 42 that has low K dopant diffused throughout the semiconductor body. The dopant 41 is shown as being selectively deposited over the region to be melted, but can also be deposited over substantially the entire surface. When irradiated, high K dopant 41 diffuses substantially throughout the melt, and low K dopant 42 segregates towards the surface upon resolidification. Therefore, the structure shown in FIG. 5 is obtained. Here, the low K dopant is dominant both in the body of the semiconductor and also in region 51 wherein it has segregated towards the surface. On the other hand, the high K dopant dominates in region 52, as it was substantially diffused throughout the melt.

As used herein, the term "deposited on" includes dopants formed on the surface of a semiconductor body by paint-on techniques, chemical deposition techniques, (including the deposition of amorphous semiconductor layers containing one or more dopants), evaporation, sputtering, and other suitable deposition techniques. Also, the term "introduced in" includes ion implantation of dopants, and solid state diffusion of dopants into the semiconductor body. However, as used herein, the term "introduced in" is limited to introducing dopants to a depth less than the subsequent melt depth in the semiconductor body. Additionally, the semiconductor body typically has a given dopant diffused substantially throughout the body, which may be the same as, or different than, either the low K or high K dopant referred to herein, as will become further apparent in the embodiments below.

Figure 6:
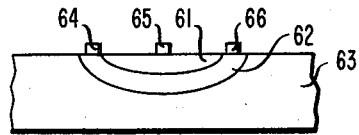
FIG. 6 shows a typical junction field effect transistor configuration.
Figure 7:
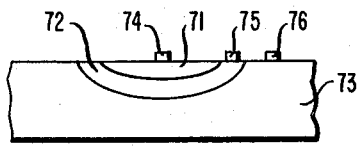
FIG. 7 shows a typical bipolar transistor configuration.

Typical devices utilizing the above structures as shown in FIGS. 6 and 7. In FIG. 6, a junction field effect transistor is shown wherein the region having the low K dopant forms the gate (61), with a gate contact (65) formed thereon. Source and drain contacts (64, 66) are formed on the channel 62, which is the high K dopant region. It will be appreciated that if the radiation beam that produces the melting has a circular cross-section, then the channel region is circular, as viewed from above in FIG. 6, with the gate being located in the middle of this region. To reduce surface leakage currents, the portion of channel 62 that reaches the surface may be oxidized, or treated by other techniques. In FIG. 7, a bipolar transistor is shown wherein the low K dopant region forms the emitter (71), the high K dopant region is the base (72), and the surrounding semiconductor material forms the collector (73). Emitter, base, and collector contacts 74, 75, 76, respectively, are formed thereon. Of course, other device configurations are possible, including diodes, etc.

The configuration shown in FIG. 3 may be used to obtain an ohmic contact by means of a highly doped surface region to any of the above-named structures, among others. In fact, two or more low K dopants may be used with a difference in segregation coefficient producing a difference in the resulting final geometries. Generally, the lower the K value, the smaller the size of the resulting region upon resolidification of the melt. For making Schottky barrier devices, the overlying low K dopant region is typically a "metallic region", typically a highly conductive metal-semiconductor alloy or compound. The height of the electrical barrier formed can be adjusted by choosing a desired doping of the underlying (high K) doped region.

Figure 8:
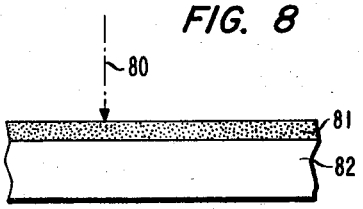
FIGS. 8–10 show the effect of multiple melting, wherein the radiation beam is displaced.
Figure 9:
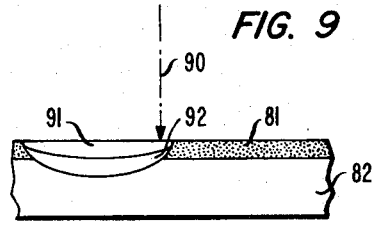
Figure 10:
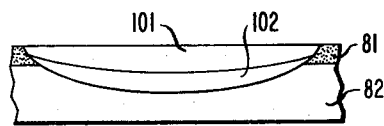

While the foregoing has been described in terms of a single stationary radiation beam, multiple beam operation is also possible. For example, if the beam is displaced slightly between pulses, the geometry of the device may be enlarged. Referring to FIG. 8, a radiation beam 80 is directed at a doped surface 81 in semiconductor body 82. The resultant structure 91 and 92 is seen in FIG. 9. In this embodiment, the melt time is sufficiently short, and the aspect ratio of the melt sufficiently large that the junction formed within the resolidified region does not intersect the surface. The radiation beam is then displaced as shown at 90, and a second melting operation takes place. Upon resolidification, the enlarged structure is shown in FIG. 10, wherein low K dopant region 101 and high K dopant region 102 are obtained. For such enlargement to occur, the second melting beam 90 must be fairly close to the position of the original beam 80. However, very large structures are obtainable by this method, even with a relatively small radiation beam. This will be illustrated further by means of the following Examples.

EXAMPLE 1

A number of p-type, (100) silicon wafers of 2Ωcm resistivity were implanted with $4 \times 10^{15} cm^{-2}$ arsenic ions at an energy of 30 keV over half of their area. Identical wafers were irradiated at <0.3 mA and >1.0 mA of ion current in order to assess possible influence of dose rate. Following implantation, the wafer surfaces were cleaned by sputter removal of ~200 Angstroms of material, and a 200 Angstrom layer of Pt was deposited over the entire wafer. Laser melting was carried out by repeated, 13 nsec pulsed irradiations with a Nd:YAG ($\lambda = 1.06$ μm) laser, which was focused to a 30 μm spot diameter. Between successive pulses, the laser beam was translated 8 μm so that large areas of processed material could be built up by successive, overlapping pulse spots. A consequence of this overlapping pulse scheme is that, on average, the surface material is frozen and remelted approximately 12 times. The laser beam was operated in the $TEM_{oo}$ mode at a pulse repetition rate of 11.5 kHz. Large areas (~1 cm × 3 cm) were laser processed at each of several laser powers, ranging from 56 to 126 MW/cm². The processed material was easily visible, being darker in color than the unreacted silicon.

Four point probe resistivity measurements were carried out on each region, and the extent of the reaction was assessed from Rutherford back scattering (RBS) spectra. The wafers were then photoresist patterned and etched to produce 0.06 cm diameter mesa structures. The I-V characteristics of these structures were then determined at room temperature by standard methods and were found to be rectifying. No effects attributable to dose rate were observed. The RBS data showed that the rectifying junction was formed between the As-dominated region and the p-type substrate; see FIG. 14. The Pt layer formed a Pt-Si alloy region comprising a mixture of doped silicon (P+) crystallites and platinum silicide crystallites. This alloy region was in ohmic contact with the underlying As-dominated region. Thus, a structure similar to that shown in FIG. 10 (not to scale) was obtained, with region 101 being an alloy in this case, rather than a doped semiconductor. The doping of the As region (102) was sufficiently high that the height of the Schottky barrier between regions 101 and 102 was negligible, with the rectifying junction being between regions 102 and 82.

EXAMPLE 2

Figure 15:
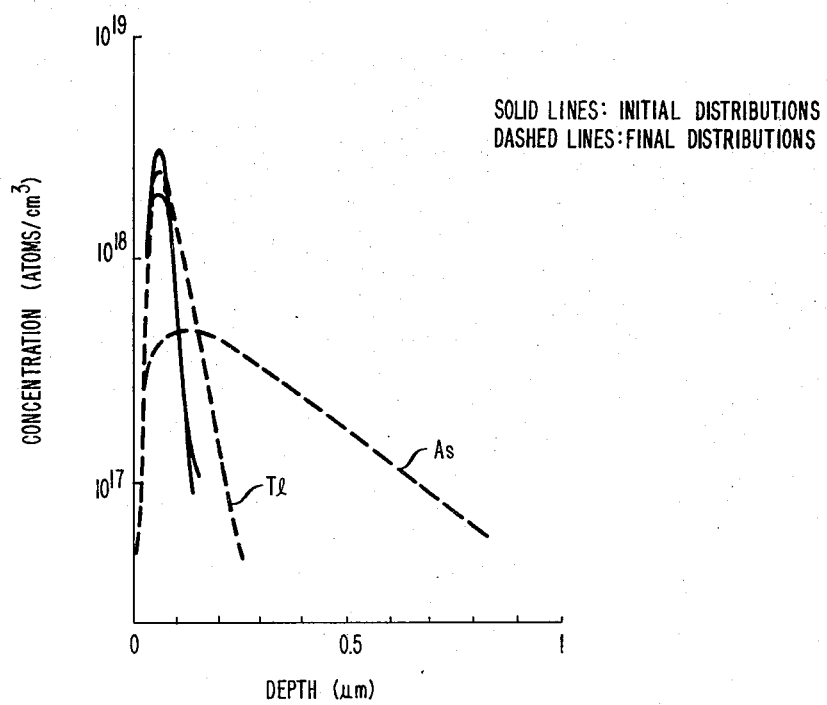

A p-type silicon wafer as in Example 1 was implanted with arsenic and thallium ions at an energy of 30 keV to produce an initial dopant distribution as shown in FIG. 15. The wafer was laser melted by overlapping laser spots each having a pulse power density of 28 MW/cm², otherwise exactly as in Example 1. The resulting dopant distribution was determined by RBS, and is shown in FIG. 15. Mesa structures were then etched in the wafer, and the I-V characteristics determined. Two rectifying junctions were obtained: one within the resolidified region, and one at the interface between the bottom portion of the resolidified region and the unmelted single crystal wafer material. A structure similar to that shown in FIG. 10 (not to scale) was obtained, with the thallium (low K) dopant dominant in region 101, arsenic (high K) dopant dominant in region 102, and the bulk dopant of the wafer dominant in region 82.

Figure 11:
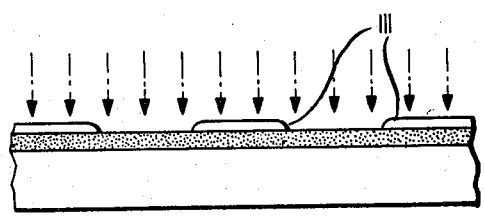
FIGS. 11–12 show the use of a mask on the surface of the semiconductor body to selectively define the melted regions.
Figure 12:
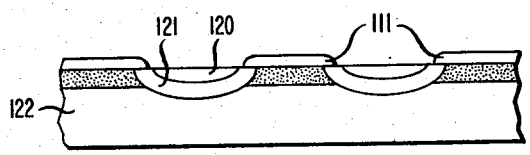

While the above devices can be formed by means of a single radiation beam or a repetitively pulsed radiation beam to selectively define the geometry of the devices, it is also possible to irradiate the area with a large diameter beam and selectively melt certain regions by means of a shadow mask. Such a mask may be separate from the semiconductor body, or may be a layer of material on the surface of the body. Shown in FIG. 11 is a semiconductor body having a surface layer 111, typically an oxide layer, deposited or grown thereon. The reflectivity of the oxide may be enhanced according to a known technique of depositing a thin metal layer thereon. When irradiated with a large area radiation beam, the semiconductor material melts in the uncovered areas. Typical resulting geometries are obtained as shown in FIG. 12. Note that at the edges of the oxide the radiation beam may still couple enough power into the underlying semiconductor body to melt the material, so that the edge of the melted zone extends underneath the oxide layer. In fact, it is known that for certain oxide thicknesses, the coupling efficiency of the radiation beam into the semiconductor body will be enhanced. This typically occurs at fairly narrow oxide thicknesses so that at the thin edge of the oxide, the melting in the semiconductor body may be enhanced. Furthermore, the mask 111 may be a metal, or a conductive metal-semiconductor alloy or compound, such as a silicide, for making contact to melted region 121. Under appropriate conditions, mask 111 can make contact to low K dopant region 120 as well.

Figure 13:
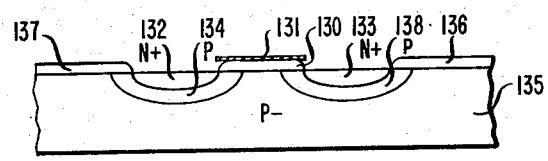
FIG. 13 shows a self-aligned MOS field effect transistor made by the mask technique.

Shown in FIG. 13 is a self-aligned metal-oxide-semiconductor field effect transistor, wherein a metallic gate region 131 overlies gate oxide region 130. The source region 132 and drain region 133 are dominated by low K dopant, which is n-type in this case. Surrounding the source and drain are p doped regions 134, 138, respectively, which are dominated by the high K dopant. These p regions reduce the depletion width of the p-n junctions formed by the p-channel and n+ source and drain, thereby alleviating the so-called "short channel" effects. If desired, the p region can be formed only around drain region 133 by selective deposition of the high K dopant material. Contact to source region 132 and drain region 133 may be made by conventional techniques, or by means of a conductive mask (137, 136) extending to contact regions 132 and 133, as noted above. In addition, the junction within the resolidified region may be formed so as to not intersect the surface, as noted above.

Figure 14:
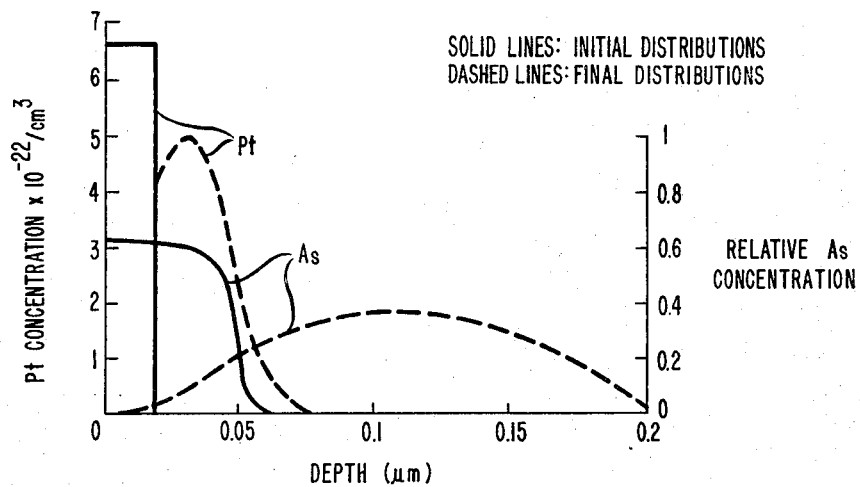
FIGS. 14–15 show typical dopant distributions produced by the inventive technique.

The doping profiles shown in FIGS. 14 and 15 show that well-defined junctions between the high K dopant and the low K dopant are obtainable for the multiple melting case of Examples 1 and 2. If the low K dopant is located on the surface prior to melting, and if the high K dopant is located in the interior of the semiconductor body as in Example 1 and FIG. 14, the abruptness of the junction will also be enhanced. This is because while both dopants tend to diffuse throughout the melt, for short melt times a dopant located nearer the surface does not have enough time to diffuse entirely throughout the melt. Thus, as the low K dopant is pushed back towards the surface, it does not have sufficient time during the melt period to diffuse entirely throughout the melt region in the above Examples. On the other hand, the high K dopant remains substantially as distributed at the end of each melt period, since rapid freezing of the melt has substantially no effect on the distribution of the high K dopant. Thus, as seen by comparing the initial and final dopant distributions in FIG. 15, multiple radiation melting pulses may be used to obtain enhanced separation of the low K and high K dopant. It can also be seen from FIGS. 14 and 15 that the depth to which the dopants are distributed in the semiconductor body can be relatively small when short duration melting is obtained. The melting occurs typically within 1 micron from the surface of the semiconductor body, with melt times of less than 10 microseconds. This allows, for example, very narrow base region and channel regions to be formed, independently of lithographic resolution limits.

It can be seen that the above procedure allows the use of a wide range of dopants that otherwise would not be used in semiconductor processing. In particular, low K dopants can be used that otherwise could not be incorporated into the semiconductor lattice in sufficient quantities by conventional techniques to make useful devices. This is because the rapid refreezing of the melt in the present technique allows a much higher concentration of dopant to be trapped in the crystal lattice than is possible by conventional heating techniques. For example, with tellurium-implanted gallium arsenide, it is known that laser melting may produce a tellurium concentration in the crystal lattice greater than 10 times the equilibrium solubility limit; see, for example, "Ohmic Contacts Produced by Laser Annealing TE-Implanted GaAs", by P. A. Barnes et al, in *Laser Solid Interactions And Laser Processing*—1978, noted above, at page 647; see also, "New Materials Properties Achievable By Ion Implantation Doping And Laser Processing", B. R. Appleton et al, Ibid, page 291. This increased solubility is enhanced by short melt times, typically less than 10 microseconds.

In fact, not only can the amount of dopant exceed the equilibrium solubility limit, but alloys and compounds of the dopant and the semiconductor can be obtained. For example, as noted in Example 1 above, platinum can form a platinum silicide layer with the silicon of the semiconductor body, as can other metals, especially transition metals. Such layers are useful for making ohmic contacts, Schottky barriers, etc., in a wide variety of semiconductor devices. Note that while the high K dopant region typically resolidifies by epitaxial regrowth on the underlying single crystal semiconductor, the low K region may or may not be epitaxial. That is, if the low K dopant is doped semiconductor, then epitaxial regrowth will occur, but if the low K region comprises metal alloys, including metal compounds such as silicides, the regrowth will typically not be epitaxial in the low K dopant region. In addition, the edges of the resolidified regions may not be single crystal epitaxial material, if not directly in contact with the single crystal substrate.

It can be seen that many of the above effects are due to the very rapid localized melting of the semiconductor body, wherein resolidification occurs very quickly. The velocity of the solid-liquid interface during freezing of the melt is typically at least 50 cm per second and the freezing of the melt typically occurs within 10 microseconds of the initiation of the melting, when pulsed radiation sources are used. However, in the cases of multiple radiation pulses described above, the total melt time may exceed this limit. If longer duration radiation is used, the melt times can increase to the order of 10 milliseconds with the present technique, while maintaining the velocity of the solid-liquid interface during freezing to at least 1 cm per second. This relatively high freezing interface velocity, among other factors, distinguishes the present technique from prior art segregation techniques, wherein a variation in the (relatively slow) freezing interface velocity produces a change in effective segregation coefficients of two dopants, in order to produce a junction. Even though relatively rapid compared to prior art segregation techniques, melt times in the range of 10 microseconds to 10 milliseconds produce effective K values significantly closer to the equilibrium K values than for shorter melt times. Thus, increased segregation of the low K dopant can be obtained with the longer melt times of the inventive technique, if desired.

A variety of high power radiation sources may be used in practicing the present invention. The presently preferred source is a laser beam due to the ease of focusing a laser beam to a small diameter and the ability to work in a normal air atmosphere. Lasers can also provide relatively large beam diameters also, if treatment of large semiconductor areas is desired. Both pulsed lasers and continuous wave (CW) lasers may be used, with the latter typically being scanned across the surface of the semiconductor body. In that case, the melt time noted above is for a given location on the semiconductor body. Other sources of radiation include electron beams, ion beams (including neutral ion beams), and xenon flash tubes. Furthermore, various semiconductor materials may be utilized. In addition to germanium and silicon, typical semiconductor materials include gallium arsenide, indium phosphide, etc. Numerous dopants, and especially low K dopants, may be utilized, with the examples given in Table 1 above being merely representative. Due to the above-noted ability to incorporate a larger amount of dopant into the semiconductor, especially for short melt times, a greatly increased number of possible dopants is available for making semiconductor devices.

While the above concepts have been shown embodied in certain device configurations, it will be recognized by one skilled in the art that numerous other device configurations are possible. For example, large surface areas of a semiconductor body can be isolated by means of a perimeter p-n junction from the rest of a semiconductor body by means of a large diameter radiation beam, or by a small diameter multiply pulsed beam. Devices can then be formed in the isolated region (e.g., region 101 of FIG. 10) by conventional techniques or by further application of the inventive technique. The ability to make silicide (and other alloy) regions allows the production of high conductivity paths as, for example, sense lines on integrated circuit memory chips. Such high conductivity paths can be isolated by an underlying junction from the rest of the semiconductor body. With pulsed radiation beams of relatively short duration, high translation rates of the beam relative to the semiconductor allow rapid formation of conductive paths in one embodiment. All such deviations and variations through which the present teaching has advanced the art are considered to be within the spirit and scope of the present invention.

I claim:

1. A method of making a semiconductor device by steps comprising melting one or more times a surface region of a semiconductor body by means of a radiation beam, wherein the duration of each melting at a given location on said body is less than 10 milliseconds, and wherein said melting extends into a single crystal region of said semiconductor body, with said single crystal region having a given dopant type immediately beneath said melted region,

CHARACTERIZED IN THAT the melted region comprises a first dopant having an equilibrium segregation coefficient of less than 0.1, and a second dopant having an equilibrium segregation coefficient of greater than 0.1, with at least said second dopand being deposited on, or introduced in, said surface region prior to said melting, and with said melting extending to a depth greater than the depth of such deposited or introduced dopant or dopants prior to said melting, whereby a junction is formed within said region upon resolidification of the melt.

2. The method of claim 1 FURTHER CHARACTERIZED in that said junction intersects said surface of said semiconductor body.

3. The method of claim 1 FURTHER CHARACTERIZED in that said radiation beam is selected from the group consisting of laser beam, electron beam, and ion beam.

4. The method of claim 1 FURTHER CHARACTERIZED in that said first dopant is deposited on, or introduced in, said surface region prior to said melting.

5. The method of claim 1 FURTHER CHARACTERIZED in that said given dopant in said single crystal region is different from said first and second dopants.

6. The method of claim 1 FURTHER CHARACTERIZED in that said given dopant in said single crystal region is said first dopant.

7. The method of claim 1 FURTHER CHARACTERIZED in that said given dopant in said single crystal region is the same as said second dopant.

8. The method of claim 1 FURTHER CHARACTERIZED in that said semiconductor is silicon.

9. The method of claim 8 FURTHER CHARACTERIZED in that said second dopant is selected from the group consisting of boron, phosphorus, and arsenic.

10. The method of claim 8 FURTHER CHARACTERIZED in that said first dopant is selected from the group consisting of lithium, aluminum, gallium, indium, thallium, antimony, bismuth, and platinum.

11. The method of claim 8 FURTHER CHARACTERIZED in that said first dopant forms a silicide with said silicon region in a portion of the resolidified region.

12. The method of claim 1 FURTHER CHARACTERIZED in that said first dopant forms an alloy or compound with said semiconductor in a portion of the resolidified region.

13. The method of claim 1 FURTHER CHARACTERIZED in that said junction forms an ohmic contact between the region dominated by said first dopant and the region dominated by said second dopant.

14. The method of claim 1 FURTHER CHARACTERIZED in that said junction is a rectifying junction.

15. The method of claim 1 FURTHER CHARACTERIZED in that said given dopant type in said single crystal region is of opposite conductivity type to said second dopant.

16. The method of claim 1 FURTHER CHARACTERIZED in that the concentration of said first dopant exceeds the equilibrium solubility limit of said dopant in said semiconductor in a portion of the resolidified region.

17. The method of claim 1 FURTHER CHARACTERIZED in that said duration of each melting at a given location on said body is less than 10 microseconds.

18. The method of claim 1 FURTHER CHARACTERIZED in that said duration of each melting at a given location on said body is greater than 10 microseconds.

* * * * *

UNITED STATES PATENT AND TRADEMARK OFFICE
CERTIFICATE OF CORRECTION

PATENT NO. : 4,364,778

DATED : December 21, 1982

INVENTOR(S) : Harry J. Leamy and Thomas E. Seidel

It is certified that error appears in the above—identified patent and that said Letters Patent is hereby corrected as shown below:

Column 4, line 58, "as" should be --are--. Column 9, line 52, "dopand" should be --dopant--.

Signed and Sealed this

Twelfth Day of April 1983

[SEAL]

Attest:

GERALD J. MOSSINGHOFF

Attesting Officer

Commissioner of Patents and Trademarks